US007639046B2

(12) United States Patent
Gemmeke et al.

(10) Patent No.: US 7,639,046 B2
(45) Date of Patent: Dec. 29, 2009

(54) METHOD TO REDUCE POWER CONSUMPTION WITHIN A CLOCK GATED SYNCHRONOUS CIRCUIT AND CLOCK GATED SYNCHRONOUS CIRCUIT

(75) Inventors: Tobias Gemmeke, Boeblingen (DE); Jens Leenstra, Bondorf (DE); Jochen Preiss, Boebligen (DE)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/850,736

(22) Filed: Sep. 6, 2007

(65) Prior Publication Data

US 2008/0169841 A1 Jul. 17, 2008

(30) Foreign Application Priority Data

Jan. 15, 2007 (DE) .................. 20 2007 100 538 U

(51) Int. Cl.

*H03K 19/00* (2006.01)
*H03K 17/16* (2006.01)
*H03K 19/003* (2006.01)
*G06F 1/00* (2006.01)
*G05F 1/10* (2006.01)
*G05F 3/02* (2006.01)

(52) U.S. Cl. .......................... 326/93; 326/33; 327/544; 713/310

(58) Field of Classification Search ............ 326/93–98; 713/300–340

See application file for complete search history.

(56) References Cited

U.S. PATENT DOCUMENTS

2003/0131270 A1* 7/2003 Abernathy et al. .......... 713/322

OTHER PUBLICATIONS

Li, et al. Deterministic Clock Gating for Microprocessor Power Reduction, ECE Department, Purdue University.

* cited by examiner

*Primary Examiner*—James H. Cho
*Assistant Examiner*—Matthew C Tabler
(74) *Attorney, Agent, or Firm*—W. Riyon Harding

(57) ABSTRACT

A method to reduce power consumption within a clock gated synchronous circuit, said synchronous circuit comprising at least two successive stages, wherein each stage if activated propagates a data signal cycle by cycle to a succeeding stage, comprising the steps of:

deriving a local clock activation signal from an external clock activation signal, wherein said local clock activation signal changes its value every cycle the external clock activation signal indicates a propagation, propagating the data signal and the local clock activation signal synchronously cycle by cycle from a particular stage to a succeeding stage whenever a local clock activation signal at the particular stage by derivation from the clock activation signal or by propagation through the synchronous circuit changes its value between two successive cycles, in order to propagate the data signal and the local clock activating signal within the same clock domain through the clock gated synchronous circuit.

12 Claims, 5 Drawing Sheets

Clock Gated Synchronous Circuit 10
Pipeline 30
data
Inverter 70
Clck_p
act_0
dact_0
I
LCB 20
Clck_cd
cntl reg 50
Clck_cd
Data reg 40
I
II
dact_1
II
=1
act_n
LCB 21
Clck_cd
cntl reg 50
Clck_cd
Data reg 40
dact_2
result
Clck_p Circuit 84

METHOD TO REDUCE POWER CONSUMPTION WITHIN A CLOCK GATED SYNCHRONOUS CIRCUIT AND CLOCK GATED SYNCHRONOUS CIRCUIT

CROSS REFERENCES TO RELATED APPLICATIONS

This application is related to German Application Number 07100538.3, filed Jan. 15, 2007 and related to Ser. No. 11/850,745 filed contemporaneously with this Application.

FIELD OF THE INVENTION

The present invention relates to clock gating in a synchronous circuit including multiple register stages.

BACKGROUND OF THE INVENTION

In a synchronous circuit within a microprocessor, a clock signal is used to define a time reference for the movement of data within that circuit. Such a synchronous circuit includes multiple register stages in what is commonly referred to as a pipeline.

Modern microprocessors suffer a huge power drawback, where power is a combination of static and dynamic contributions, where the static contribution is approximately proportional to the silicon area of a macro. One approach to reduce dynamic power is to switch off the clock signal of not required register stages within the synchronous circuit. This procedure is also known as clock gating. By clock gating, the power dissipated in the clock mesh is reduced as well as data switching power is reduced. The latter is due to the fact that the outputs of the registers are constant if there is no clock signal.

To maximize the benefit of clock gating clock activation or deactivation is performed in a small grain—in the extreme case on a single cycle basis.

A simple clock gating scheme is known from Li et Al, "Deterministic Clock Gating for Microprocessor Power Reduction"; Proceedings of the 9$^{th}$ International Symposium on High Performance Computer-Architecture, 2003, pp. 113-122, wherein a register to be clock gated is connected with the output of an AND-gate whose first input is fed with the clock signal and whose second input is fed with a clock activation signal. A problem in applying this approach for a pipeline is that for each stage a clock activate signal plus a clock signal is needed that are synchronously fed to AND-gates dedicated to the stages.

A common solution for this problem is to generate local clock signals by local clock buffers (LCB) within the stages and to provide a clock activate signal for the first stage of a pipeline and to propagate this clock activate signal parallel to the data signal through the pipeline. The clock activation signal when propagated from stage to stage activates the LCB of a stage it reaches which LCB activates the particular stage by clocking a data register in order to forward a data signal stored within that data register to the next stage. To propagate the clock activation signal from stage to stage synchronous with the data signal, control registers arranged in parallel to the data registers of the pipeline are used. Since the LCB of a stage that activates the data register belonging to that stage would continue to activate the clock whenever the corresponding clock activation signal stored in the control register of the previous stage is high, the control registers of the stages have to be clocked at least twice. Thereby the first clocking is to latch a clock activation signal into the control register in order to activate the LCB of the data register and the second clocking is to reset the clock activation signal in that control register in order to stop activation of the LCB. Due to this, the clock activation signal cannot be propagated through the pipeline within the same clock domain as the data signal as long as the wider and therefore higher power data registers are clocked only once. According to the state of the art, a second LCB per stage is required that forms the clock domain for the clock activation signal propagation within the pipeline.

State-of-the-art circuitries as the circuitry 1 shown in FIG. 1 use a clock activate signal act to activate a LCB 2 in order to activate a set of data clock signals clck_d for the corresponding cycle. Within the circuitry 1, the data clock signals clck_d are provided by a first LCB 2 per stage. The LCB 2 derives the clock signal clck_d from a primary clock signal clck_p generated by a main clock not shown. The LCB 2 can be activated or deactivated by the clock activation signal act. This clock activate signal act is propagated synchronous with the data through the pipeline 3 as schematically depicted by act_0, act_1 for the clock activation signal at the first stage (act_0) and second stage (act_1). Whereby the clock activate signals act stored in control registers 5, each control register 5 associated with each stage of the pipeline 3 indicates whether valid stage data is in the stage and clocking has to be performed or not. To switch on and off this clock activate signal act any control register 5 storing a clock activate signal act has to be clocked at least twice. Hence, the clock activate signal act cannot be latched with the same registers 4 as the data-signals, since compared to the registers 4, the control registers 5 have to be clocked with at least twice. Due to this, the clock activation signal act is propagated within the control registers 5 associated with the stages of the pipeline 3 but clocked within another clocking domain than the registers 4. In order to propagate the clock activation signal act from stage to stage, a second LCB 6 is required per stage. The LCB 6 forms the second clock domain for the clock activation signal act. The LCB 6 derives the control clock signal clck c from the primary clock signal clck_p generated by the main clock not shown. Thereby the switching activity of the control clock signal clck_c is higher than the one of the data clock signal clck_d. Within the example shown, the clock activity of the LCB 6 is twice as high as clock activity of the LCB 2 in the worst-case. An activation of the second LCB 6 takes place if either an incoming activation signal act_0 or an outgoing activation signal act_1 of the particular stage is high, i.e. has a value of '1'.

A main drawback of the synchronous circuit according to the state of the art is that in each stage of the pipeline, two LCBs are needed, one for the clock domain of the data registers for the data signal and a second one for the clock domain of the control registers. This is disadvantageous because LCBs are highly complex and large circuitries with high silicon area requirements and high active as well as leakage power consumption.

SUMMARY OF THE INVENTION

It is therefore an object of the invention to provide a method to reduce power consumption within a clock gated synchronous circuit, plus to provide a clock gated synchronous circuit to be used to perform such a method.

The first object of the invention is met by a method to reduce power consumption within a clock gated synchronous circuit, wherein said synchronous circuit comprises at least two successive stages, wherein each stage if activated propagates a data signal cycle by cycle to a succeeding stage. Said method according to the invention comprises the steps of:

deriving a local clock activation signal from an external clock activation signal which external clock activation signal if high specifies that a corresponding data signal is valid and has to be propagated through the synchronous circuit by activating a particular stage and if low specifies that a corresponding data signal is invalid and clock gating has to be performed by deactivating a particular stage, wherein said local clock activation signal changes its value every cycle the external clock activation signal is high, propagating the data signal and the local clock activation signal synchronously cycle by cycle from a particular stage to a succeeding stage by activating said particular stage whenever a local clock activation signal at the particular stage by derivation from the clock activation signal or by propagation through the synchronous circuit changes its value between two successive cycles, in order to propagate the data signal and the local clock activating signal within the same clock domain through the clock gated synchronous circuit.

Thereby it is important to mention that it is free to define, whether the external clock activation signal is high or low at high or low voltage or vice versa.

BRIEF DESCRIPTION OF THE DRAWINGS

The foregoing, together with other objects, features, and advantages of this invention can be better appreciated with reference to the following specification, claims and drawings, with:

DETAILED DESCRIPTION

Figure 1:
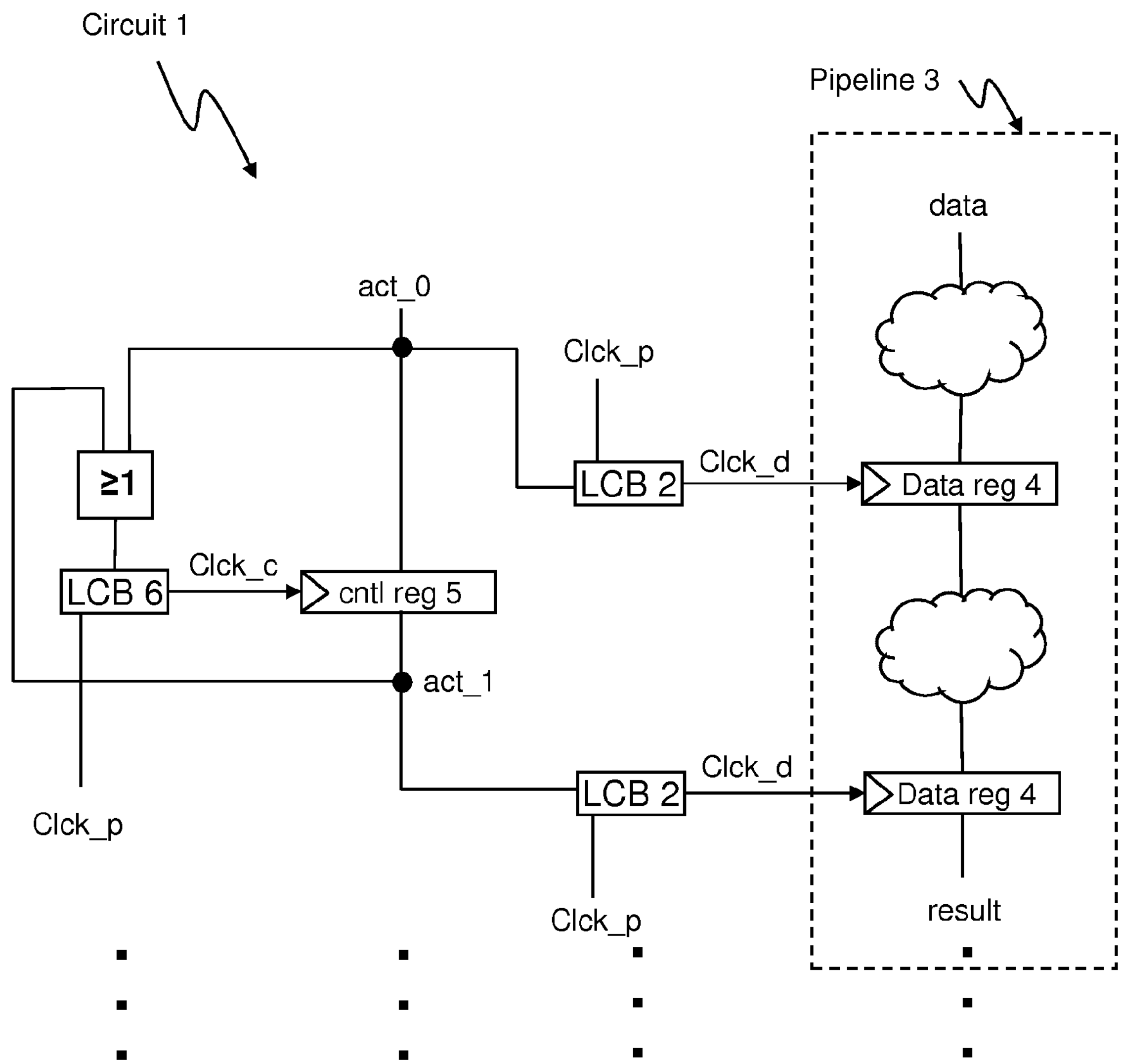
FIG. 1 showing a schematic depiction of a clock gated synchronous circuit according to the state of the art, FIG. 2 showing a schematic depiction of a clock gated synchronous circuit according to the invention, FIG. 3 showing a schematic depiction of a first embodiment of a first stage of a clock gated synchronous circuit according to the invention, FIG. 4 showing a schematic depiction of a second embodiment of a first stage of a clock gated synchronous circuit according to the invention, and FIG. 5 showing a schematic depiction of a following stage of a clock gated synchronous circuit according to the invention.

The idea behind the method according to the invention is to propagate a signal activating the particular stages of a pipeline within the same clock domain as the data signal itself in order to save the LCBs for the clock activation signal clock domain within the pipeline. To do so, the clock activation signal used in common microprocessors cannot be used. A new local clock-activation signal derived from the common external clock activation signal is needed showing attributes allowing propagating it within the same clock domain as the data signal. The solution is a local clock activation signal that by changing its value from one cycle to another indicates that a particular stage has to be activated. In this way, the local clock activation signal only needs to be clocked once per cycle, i.e. within the same clock domain as the data signal. Hence, the local clock activate signal can be latched in the same clock domain as the data signal. The benefit of this approach is two-fold: First, any data and control register is clocked only a single time per data signal and pipeline stage. Second, a single clock domain can be used for the local clock activation and the data signals, i.e. the LCB commonly used for the clock domain of the clock activation signal can be saved, reducing silicon area, cost and power consumption.

It is thus an additional advantage of the method according to the invention, that particularly within pipeline architectures with short pipelines, i.e. with few stages, LCBs can be saved compared to the state of the art. Also within large pipelines, power savings are significant.

According to a preferred embodiment of the method according to the invention, the derivation of the local clock activation signal from the external clock activation signal is performed in a first stage of the synchronous circuit, wherein a propagation of the local clock activation signal and of the data signal at the first stage is controlled by the external clock activation signal.

A particularly preferred embodiment of the method according to the invention comprises the steps of:

activating a first stage of the synchronous circuit whenever a external clock activation signal is high, generating a local clock activation signal within said first stage that changes its value whenever said first stage is activated, activating a following stage when the local clock activation signal propagated to said following stage changes its value compared to the last local clock activation signal propagated to said stage within the last cycle a propagation occurred.

According to another preferred embodiment of the method according to the invention, generating a local clock activation signal within said first stage that changes its value whenever said first stage is activated is performed by a first stage control register activated synchronously to a first stage data register by a first stage LCB activated by the external clock activation signal, wherein the output of the first stage control register is used as an input for a second stage control register, and wherein the output of the first stage control register is inverted and re-used as an input of the first stage control register too.

According to an additional preferred embodiment of the method according to the invention, activating a following stage when the local clock activation signal propagated to said stage changes its value compared to the last local clock activation signal propagated to said stage within the last cycle a propagation occurred is performed by using one control register per stage to latch the local clock activation signal cycle by cycle when the particular stage is activated and wherein a changing of the value of the local clock activation signal is determined by comparing the input of the control register of said particular stage with the output of said control register of said stage.

According to a particularly preferred embodiment of the method according to the invention, comparing the input of the control register of a particular stage with the output of said control register of said stage is performed by an XOR-gate with the input and the output of the control register of the particular stage as inputs of said XOR-gate respectively, and the output of said XOR-gate being used to activate the LCB of that particular stage clocking the control register and the data register synchronously in order to propagate the local clock activation signal and the data signal synchronously to the next stage.

A main idea of this embodiment of the method according to the invention is to activate a stage comprising a LCB, a control and a data register by arranging a XOR-gate between the input and the output of the data register wherein the output of the XOR-gate is used to activate the LCB of said stage. An advantage of this embodiment is that it is cheap and easy to realize.

A second aspect of the invention concerns a clock gated synchronous circuit to perform a method mentioned above. The clock gated synchronous circuit comprises at least two successive stages of at least a control register, a data register and a LCB each, wherein each stage if activated propagates a data signal stored within the data register cycle by cycle to a data register of a succeeding stage. Said clock gated synchronous circuit according to the invention comprises means to derive a local clock activation signal from an external clock activation signal which external clock activation signal if high specifies that a corresponding data signal is valid and has to be propagated through the synchronous circuit by activating a particular stage and if low specifies that a corresponding data signal is invalid and clock gating can be performed by deactivating a particular stage, wherein said local clock activation signal changes its value every cycle the external clock activation signal is high, means to propagate the data signal and the local clock activation signal synchronously cycle by cycle from a particular stage to a succeeding stage by activating said particular stage whenever a local clock activation signal at the particular stage by derivation from the clock activation signal or by propagation through the synchronous circuit changes its value between two successive cycles, in order to propagate the data signal and the local clock activating signal within the same clock domain through the clock gated synchronous circuit.

According to a preferred embodiment of the clock gated synchronous circuit according to the invention, the means to derive a local clock activation signal from an external clock activation signal are arranged within a first stage of said clock gated synchronous circuit, wherein said first stage also comprises means to activate said first stage by said external clock activation signal, in order to control a propagation of the local clock activation signal and of the data signal at the first stage by the external clock activation signal.

According to an additional preferred embodiment of the clock gated synchronous circuit according to the invention, the means to activate the first stage by the external clock activation signal comprise a LCB activated by the external clock activation signal, wherein the LCB when activated clocks the control register and the data register of the first stage.

According to a particularly preferred embodiment of the clock gated synchronous circuit according to the invention, the means to derive a local clock activation signal from an external clock activation signal comprise a first stage control register activated synchronously to a first stage data register by a first stage LCB, wherein the output of the first stage control register is connected with the input of a second stage control register, and wherein the output of the first stage control register via an inverter is connected with the input of the first stage control register too.

Said means to derive a local clock activation signal from an external clock activation signal generate a local clock activation signal within said first stage that changes its value whenever said first stage is activated. Doing so ensures that each time the external clock activation signal activates the first stage LCB the local clock activation signal propagated from the first stage control register to the second stage control register changes its value.

A preferred embodiment of the clock gated synchronous circuit according to the invention comprises means to activate a following stage when the local clock activation signal propagated to said following stage changes its value compared to the last local clock activation signal propagated to said stage within the last cycle a propagation occurred.

According to a preferred embodiment of the clock gated synchronous circuit according to the invention, the means to activate a following stage when the local clock activation signal propagated to said following stage changes its value compared to the last local clock activation signal propagated to said stage within the last cycle a propagation occurred comprise a control register per stage to latch the local clock activation signal cycle by cycle when the particular stage is activated and means to compare the input of the control register of the particular stage with the output of said control register of said stage.

According to an additional preferred embodiment of the clock gated synchronous circuit according to the invention, the means to compare the input of the control register of the particular stage with the output of said control register of said stage comprise an XOR-gate connected with the input and the output of the control register of the particular stage as inputs of said XOR-gate respectively, wherein the output of said XOR-gate is connected with the LCB of that particular stage to activate the control register and the data register of the particular stage synchronously when activating the LCB by the output of the XOR-gate, in order to propagate the local clock activation signal and the data signal synchronously to the next stage.

According to a particularly preferred embodiment of the clock gated synchronous circuit according to the invention, the first stage of the circuit comprises a LCB activated by the external clock activation signal, a control register and a data register, both connected with the LCB of the first stage in order to be activated when the LCB is activated by the external clock activation signal, wherein the first stage control register with its output is connected with the input of a control register of a succeeding stage and the output of the first stage data register is connected with the input of the data register of the succeeding stage and wherein the output of the first stage control register is also connected with an inverter that is connected with the input of the first stage control register, in order to generate the local clock activation signal that whenever the first stage is activated by the external clock activation signal being high changes its value and is propagated to the next stage synchronously to a data signal, and wherein any following stage comprises a control register connected with a control register of a previous and/or a succeeding stage, a data register connected with a data register of a previous and/or a succeeding stage and a LCB connected with its output with the control and data register of the particular stage in order to activate them synchronously when activated, wherein the LCB further is connected with an output of an XOR-gate whose inputs are connected with the input and the output of the control register of the particular stage respectively in order to activate the LCB whenever the local clock activation signal propagated to said stage changes its value compared to a previous cycle an activation occurred.

The idea is to propagate a local clock activation signal instead of the common clock activation signal through the pipeline. In this way, the differential clock activation signal only needs to be clocked once. Hence, the local clock activate signal can be latched in the same clock domain as the data signal. The benefit of this approach is two-fold: First, any register and clock signal is clocked only a single time per data word and pipeline stage. Second, a single clock domain can be used for clock activation and data signals.

Figure 2:
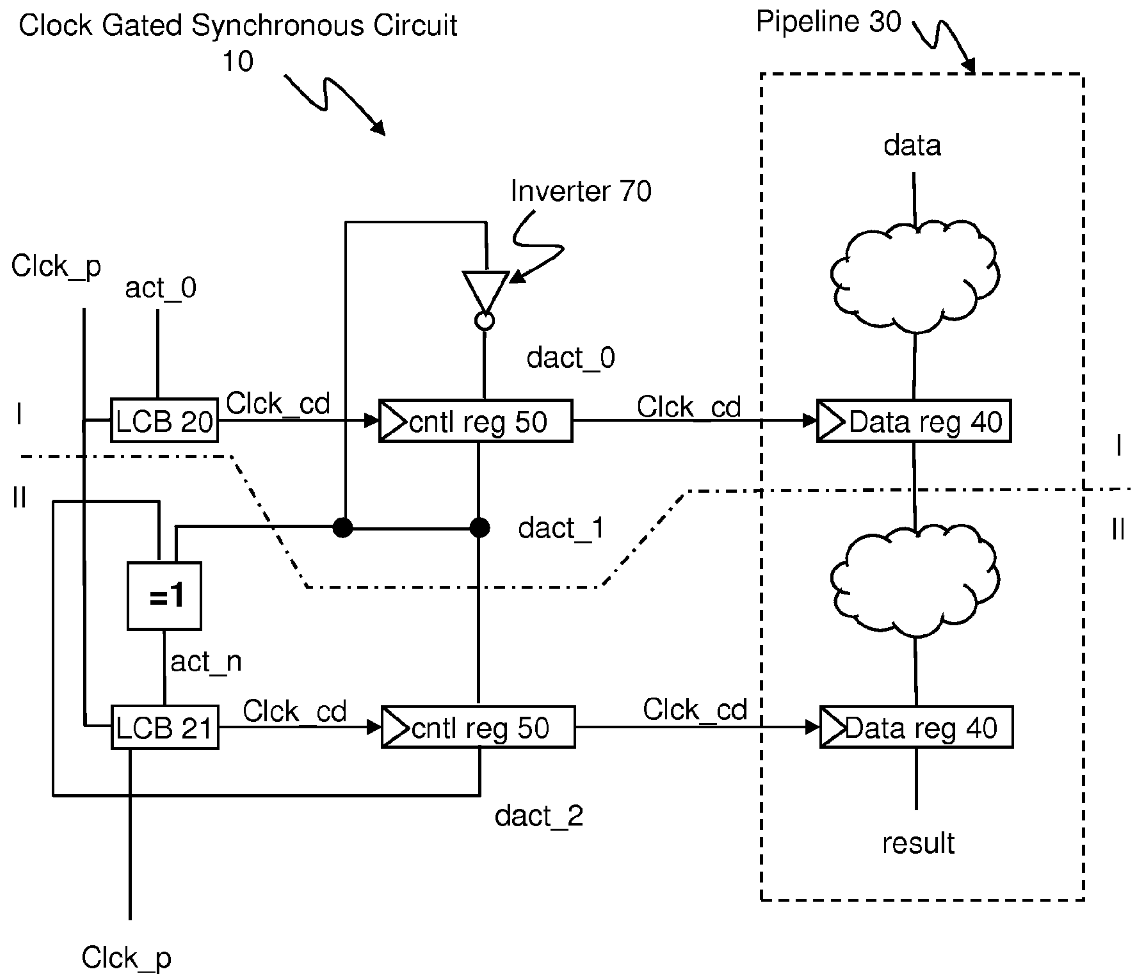

An example of a clock gated synchronous circuit 10 applying this principle is shown in FIG. 2. The LCBs 20, 21 on the left generate gated clock signals clck_cd for the control 50 as well as data registers 40. The primary external clock activation signal act_0 is fed to the LCB 20 of the first stage I of the pipeline 30 only. The LCB 21 of the second stage II of the pipeline 30 is activated by a local clock activation signal dact_1 derived from the external clock activation signal act_0. The local clock activation signal dact_1 changes its value every time the external clock activation signal act_0 is high and the LCB 20 is activated. The local clock activation signal dact_1 by activation of the control register 50 of the first stage I synchronously to the data register 40 of the first stage I is propagated to the second stage II where it becomes the local clock activation signal dact_2. By adequate means within each stage the LCBs 20, 21 and all following LCBs of the pipeline 30 are activated whenever a local clock activation signal dact_1, dact_2, . . . , dact_n, dact_n+1 propagated to the particular stage I, I, . . . , n, n+1 respectively changes its value (see also FIG. 5).

Figure 3:
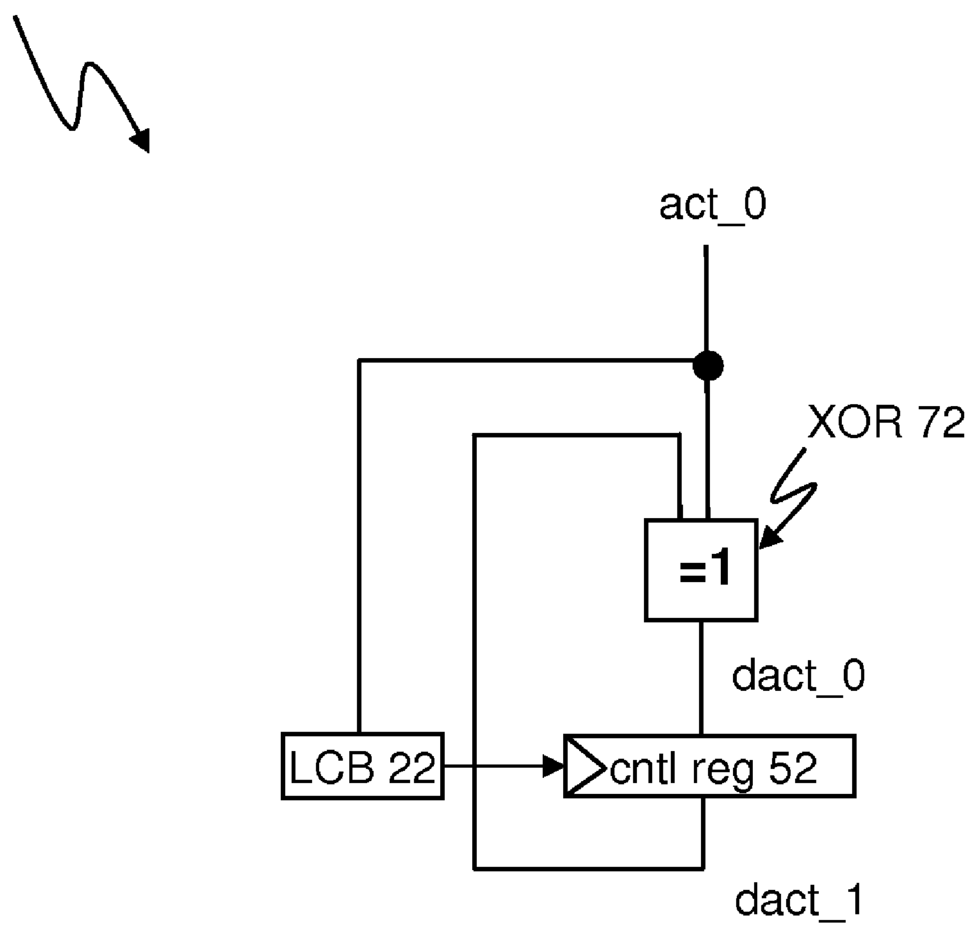

FIG. 3 shows one preferred embodiment of a circuitry 82 to generate the local clock activation signal dact_1 of FIG. 2, which is propagated to the following stages. For this purpose the actual contents of the control register 52 is inverted in case of act_0 being high. This way the input to the control register dact_0 is of inverse polarity as compared to its output dact_1 whenever the primary clock activation signal act_0 is high. This logic ensures proper polarity of dact_1 as long as the LCB 22 activates the control register 52 at least during times when act_0 is high.

Figure 4:
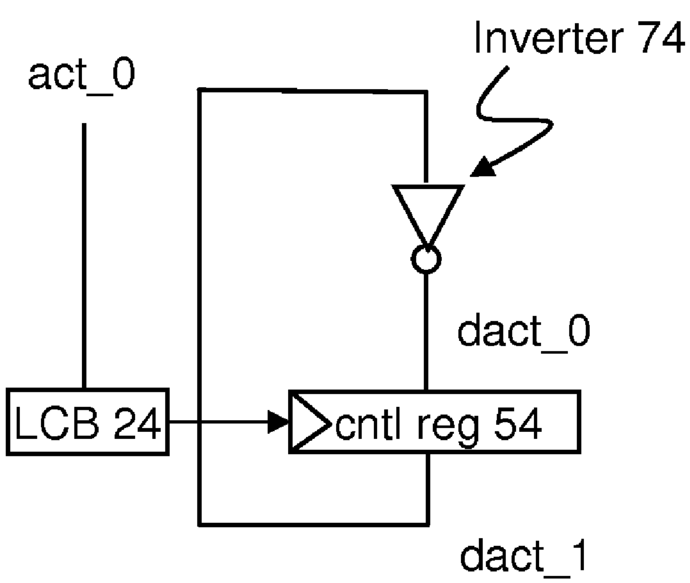

If the local clock activation signal dact_0 of the first stage I in FIG. 2 is only latched in the case act_0 is high, the XOR 72 of the circuitry 82 in FIG. 3 can be replaced by a simple inverter 70 or 74 as in the first stage I of the clock gated synchronous circuit 10 of FIG. 2 or in the circuitry 84 shown in FIG. 4 respectively. In this way the external clock activating signal act_0 is exploited as functional clock gating signal in the first stage, i.e. the first stage I control register 50, 54 captures the inverted output value only if the first stage I control register 50, 54 is activated.

Figure 5:
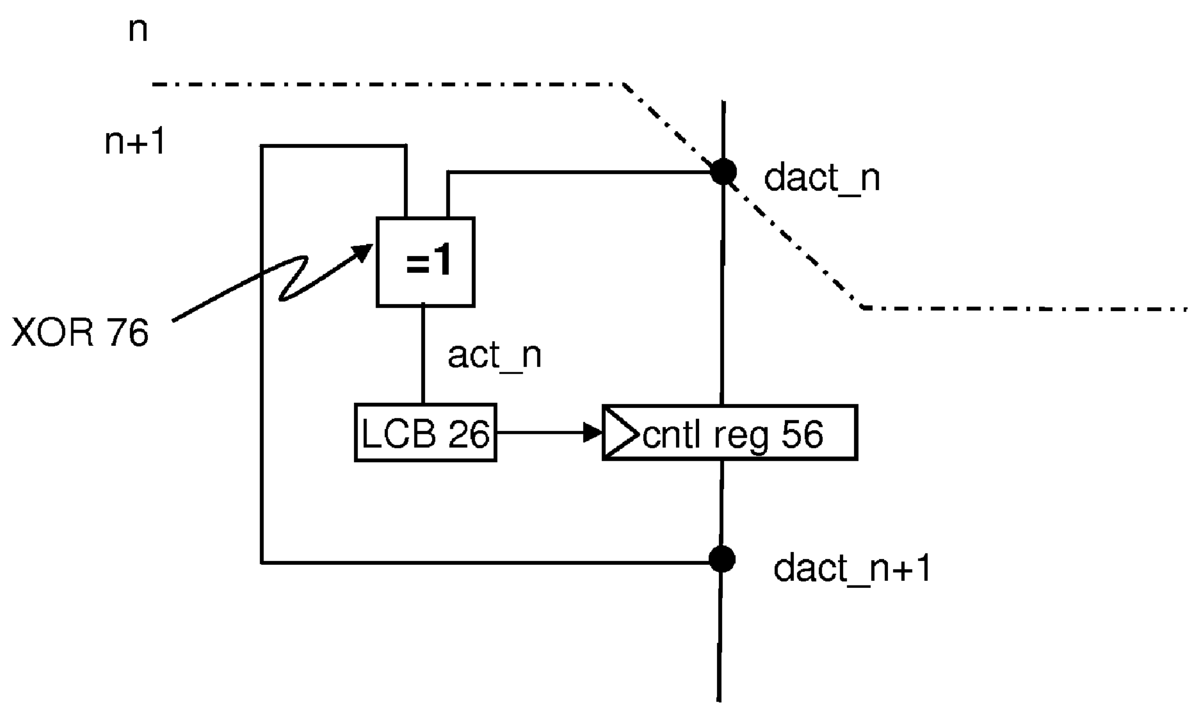

FIG. 5 shows how the new local clock activation signal dact_n is propagated from stage n to stage n+1 (dact_n+1). The control register 56 shown acts as simple staging or pipeline latches. The circuitry 86 is functional as long as the LCB 26 activates the corresponding control register 56 at least during times when an internal clock activation signal act_n derived from the local clock activation signal dact_n is high, where the internal clock activation signal act_n that activates the LCB 26 is derived by XORing the input and output of the control latch, i.e. by comparing the local clock activation signal dact_n+1 propagated to the next stage n+1 with the local clock activation signal dact_n received from the previous stage n, by an XOR-gate 76. By doing so, the internal clock activation signal act_n is high, whenever the local clock activation signal dact_n changes its value.

While the present invention has been described in detail, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method to reduce power consumption within a clock gated synchronous circuit, said synchronous circuit comprising at least two successive stages, wherein each stage if activated propagates a data signal cycle by cycle to a succeeding stage, said method comprising the steps of: deriving a local clock activation signal from an external clock activation signal which external clock activation signal if high specifies that a corresponding data signal is valid and has to be propagated through the synchronous circuit and if low specifies that a corresponding data signal is invalid and clock gating has to be performed, wherein said local clock activation signal changes its value every cycle the external clock activation signal is high; propagating the data signal and the local clock activation signal synchronously cycle by cycle from a particular stage to a succeeding stage whenever a local clock activation signal at the particular stage by derivation from the clock activation signal or by propagation through the synchronous circuit changes its value between two successive cycles, in order to propagate the data signal and the local clock activating signal within the same clock domain through the clock gated synchronous circuit;

wherein the step of propagating the data signal and the local clock activation signal from a particular stage to a succeeding stage does not require using a first clock domain for a data register and a second clock domain for a control register; and wherein the derivation of the local clock activation signal from the external clock activation signal is performed in a first stage of the synchronous circuit, wherein a propagation of the local clock activation signal and of the data signal at the first stage is controlled by the external clock activation signal.

2. The method according to claim 1, comprising the additional steps of: activating a first stage of the synchronous circuit whenever a external clock activation signal is high, generating a local clock activation signal within said first stage that changes its value whenever said first stage is activated; activating a following stage when the local clock activation signal propagated to said following stage changes its value compared to the last local clock activation signal propagated to said stage within the last cycle a propagation occurred.

3. The method according to claim 2, comprising the additional step of generating a local clock activation signal within said first stage that changes its value whenever said first stage is activated is performed by a first stage control register activated synchronously to a first stage data register by a first stage local clock buffer (LCB) activated by the external clock activation signal, wherein the output of the first stage control register is used as an input for a second stage control register, and wherein the output of the first stage control register is inverted and re-used as an input of the first stage control register too.

4. The method according to claim 2, comprising the additional step of activating a following stage when the local clock activation signal propagated to said stage changes its value compared to the last local clock activation signal propagated to said stage within the last cycle a propagation occurred is performed by using one control register per stage to latch the local clock activation signal cycle by cycle when the particular stage is activated and wherein a changing of the value of the local clock activation signal is determined by comparing the input of the control register of said particular stage with the output of said control register of said stage.

5. The method according to claim 4, comprising the additional step of comparing the input of the control register of a particular stage with the output of said control register of said stage is performed by an XOR-gate with the input and the output of the control register of the particular stage as inputs of said XOR-gate respectively, and the output of said XOR-gate being used to fire the LCB of that particular stage activating the control register and the data register synchronously in order to propagate the local clock activation signal and the data signal synchronously to the next stage.

6. A clock gated synchronous circuit said clock gated synchronous circuit comprising at least two successive stages of at least a control register, a data register and a local clock buffer (LCB) each, wherein each stage if activated propagates a data signal stored within the data register cycle by cycle to a data register of a succeeding stage, said synchronous circuit comprising: a means to derive a local clock activation signal from an external clock activation signal which external clock activation signal if high specifies that a corresponding data signal is valid and has to be propagated through the synchronous circuit and if low specifies that a corresponding data signal is invalid and clock gating can be performed, wherein said local clock activation signal changes its value every cycle the external clock activation signal is high; a means to propagate the data signal and the local clock activation signal synchronously cycle by cycle from a particular stage to a succeeding stage whenever a local clock activation signal at the particular stage by derivation from the clock activation signal or by propagation through the synchronous circuit changes its value between two successive cycles, in order to propagate the data signal and the local clock activating signal within the same clock domain through the clock gated synchronous circuit; wherein the means to propagate the data signal and the local clock activation signal from a particular stage to a succeeding stage does not require using a first clock domain for the data register and a second clock domain for the control register; and wherein that the means to derive a local clock activation signal from an external clock activation signal are arranged within a first stage of said clock gated synchronous circuit, wherein said first stage also comprises means to activate said first stage by said external clock activation signal.

7. The clock gated synchronous circuit according to claim 6, wherein the means to activate the first stage by the external clock activation signal comprise a LCB fired by the external clock activation signal, wherein the LCB when fired activates the control register and the data register of the first stage.

8. The clock gated synchronous circuit according to claim 6, wherein the means to derive a local clock activation signal from an external clock activation signal comprise a first stage control register activated synchronously to a first stage data register by a first stage LCB, wherein the output of the first stage control register is connected with the input of a second stage control register, and wherein the output of the first stage control register via an inverter is connected with the input of the first stage control register too.

9. The clock gated synchronous circuit according to claim 6, wherein the means to activate a following stage when the local clock activation signal propagated to said following stage changes its value compared to the last local clock activation signal propagated to said stage within the last cycle a propagation occurred.

10. The clock gated synchronous circuit according to claim 9, wherein the means to activate a following stage when the local clock activation signal propagated to said following stage changes its value compared to the last local clock activation signal propagated to said stage within the last cycle a propagation occurred comprise a control register per stage to latch the local clock activation signal cycle by cycle when the particular stage is activated and means to compare the input of the control register of the particular stage with the output of said control register of said stage.

11. The clock gated synchronous circuit according to claim 10, wherein the means to compare the input of the control register of the particular stage with the output of said control register of said stage comprise an XOR-gate connected with the input and the output of the control register of the particular stage as inputs of said XOR-gate respectively, wherein the output of said XOR-gate is connected with the LCB of that particular stage to activate the control register and the data register of the particular stage synchronously when firing the LCB by the output of the XOR-gate, in order to propagate the local clock activation signal and the data signal synchronously to the next stage.

12. The clock gated synchronous circuit wherein a first stage of the circuit comprises a LCB activated by the external clock activation signal (act_D), a control register and a data register, both connected with the LCB of the first stage (1) in order to be activated when the LCB is activated by the external clock activation signal (act_D), wherein the first stage (1) control register with its output is connected with the input of a control register of a succeeding stage (H) and the output of the first stage (1) data register is connected with the input of the data register of the succeeding stage (II) and wherein the output of the first stage (1) control register is also connected with an inverter that is connected with the input of the first stage (1) control register, in order to generate the local clock activation signal (dact_I) that whenever the first stage (1) is activated by the external clock activation signal (act_D) being high changes its value and is propagated to the next stage (II) synchronously to a data signal, and wherein any following stage (II, . . . , n, n+1) comprises a control register connected with a control register of a previous and/or a succeeding stage, a data register connected with a data register of a previous and/or a succeeding stage and a LCB connected with its output with the control and data register of the particular stage in order to clock them synchronously when activated, wherein the LCB further is connected with an output of an XOR-gate whose inputs are connected with the input and the output of the control register of the particular stage respectively in order to activate the LCB whenever the local clock activation signal (dact_n) propagated to said stage changes its value compared to a previous cycle an activation occurred; and wherein the derivation of the local clock activation signal from the external clock activation signal is performed in a first stage of the synchronous circuit, wherein a propagation of the local clock activation signal and of the data signal at the first stage is controlled by the external clock activation signal.

* * * * *